United States Patent [19]

Josquin

[11] Patent Number: 5,258,633

[45] Date of Patent: Nov. 2, 1993

[54] SEMICONDUCTOR DEVICE HAVING AN IGFET WITH DIFFUSED GATE CONNECTION

[75] Inventor: Wilhelmus J. M. J. Josquin, Eindhoven, Netherlands

[73] Assignee: U.S. Philips Corp., New York, N.Y.

[21] Appl. No.: 717,304

[22] Filed: Jun. 18, 1991

[30] Foreign Application Priority Data

Jun. 20, 1990 [GB] United Kingdom ............... 9013726

[51] Int. Cl.$^5$ ...................... H01L 27/02; H01L 29/04
[52] U.S. Cl. .................................. 257/262; 257/273; 257/412; 257/754
[58] Field of Search ............. 357/43, 59, 42, 44; 257/262, 273, 412, 754

[56] References Cited

U.S. PATENT DOCUMENTS

| | | | |
|---|---|---|---|
| 4,400,865 | 8/1983 | Goth et al. ................... | 357/36 |
| 4,420,871 | 12/1983 | Scheibe ........................ | 357/43 |
| 4,424,621 | 1/1984 | Abbas et al. ................. | 357/49 |
| 4,641,170 | 2/1987 | Ogura et al. ................. | 357/35 |
| 4,673,965 | 6/1987 | Rusch .......................... | 357/43 |
| 4,727,046 | 2/1988 | Tuntasood et al. ........... | 357/43 |
| 4,784,971 | 11/1988 | Chiu et al. ................... | 357/59 H |
| 4,881,120 | 11/1989 | Nakagawa ................... | 357/38 |
| 4,970,174 | 11/1990 | Min et al. .................... | 357/43 |
| 5,026,654 | 6/1991 | Tanba et al. ................. | 357/59 H |
| 5,065,209 | 11/1991 | Spratt et al. ................. | 357/59 H |

OTHER PUBLICATIONS

IBM Technical Disclosure Bulletin, vol. 32, #6B, Nov. 1989, "Double Poly Buried Contact Process".

Primary Examiner—Rolf Hille
Assistant Examiner—Mahshid Saadat
Attorney, Agent, or Firm—Steven R. Biren

[57] ABSTRACT

A semiconductor body (1) defines at least one active device. In the example shown in FIG. 1 complementary n channel and p channel IGFETs (10 and 20) are provided. An electrically conductive region, which may form the gate conductive region (101 and 102) of the insulated gates (11 and 21) of an IGFET, is provided on a first major surface (2) of the semiconductor body (1) and is encapsulated within a covering insulating region (300,400). An area (100a) of the electrically conductive region (101 and 102) contacts a relatively highly doped semiconductor region (50) provided adjacent the one major surface (2) and electrical contact is made to the electrically conductive region (101 and 102) via a conductive track (205) provided on the first major surface (2) and a conductive path provided by the relatively highly doped semiconductor region (50). It is thus not necessary to form a contact opening through the covering insulating region (300,400) to enable contact to the electrically conductive region (101 and 103) and accordingly electrical interconnections can overlap or cross over the encapsulated electrically conductive region (101 and 102).

14 Claims, 8 Drawing Sheets

SEMICONDUCTOR DEVICE HAVING AN IGFET WITH DIFFUSED GATE CONNECTION

BACKGROUND OF THE INVENTION

This invention relates to a semiconductor device and to a method of manufacturing such a device.

Semiconductor devices are known which comprise a semiconductor body having a first major surface and defining at least one active device, an electrically conductive region provided on the first major surface, a covering insulating region encapsulating the electrically conductive region, and a conductive track provided on the first major surface so as to make electrical contact with the electrically conductive region.

GB-A-2208965 describes such a device in which the encapsulated electrically conductive region forms the gate conductive region of the insulated gate of an insulated gate field effect transistor (IGFET or MOSFET). In particular, GB-A-2208965 describes a mixed bipolar-MOSFET technology, as shown a so-called BICMOS technology, in which bipolar transistors are formed with complementary conductivity type MOSFETs (CMOS). In the example discussed, the device areas for the bipolar transistor, n-channel IGFET and p-channel IGFET are defined by field oxide. A first doped and silicided polycrystalline silicon layer covered by an insulating capping layer is patterned to define the insulated gates of the n-channel and p-channel IGFETS, and to define a doped layer for contacting the first major surface for providing a source of impurities to form an outer or extrinsic subsidiary region of the bipolar base region. Impurities are implanted using this structure as a mask to form lowly doped source and drain extension regions and to provide a proportion of the dopants for forming the intrinsic or inner subsidiary region of the bipolar base region. The gate conductive regions and extrinsic base defining region are then encapsulated by the formation of insulating spacer regions on the exposed side walls. After introduction of impurities for forming the source and drain regions and the intrinsic subsidiary base region, a second doped and silicided polycrystalline silicon layer is provided for forming source and drain contact regions and for forming the emitter region of the bipolar transistor. The second doped polycrystalline silicon layer as provided extends over the encapsulated insulated gates and a planarisation step is then used in which a planarising layer is etched back to expose only the top surface of the second doped polycrystalline silicon layer which lies over the encapsulated insulated gate. The exposed doped polycrystalline silicon is then etched to remove only that portion extending over the encapsulated insulated gate so as to form separated doped polycrystalline silicon contact regions on the source and drain regions. After removal of the planarising layer, a dielectric layer is provided and contact windows opened to enable electrical contact to be made via subsequent metallisation to the bipolar transistor and to the source, drain and insulated gate of the IGFETS. The provision of the doped polycrystalline silicon contact regions on the source and drain regions enables the metallisation contact windows to be formed over the field oxide onto which the doped polycrystalline source and drain contact regions extend so that the metallisation contacts are not directly over the source and drain regions. The possibility of the metallisation accidentally overlapping onto the insulated gate is thus much reduced which should enable alignment tolerances to be reduced and therefore provides a technology capable of producing devices with high packing density and which are adapted to computer aided design (CAD) techniques. It is, however, still necessary to enable contact holes to be made through the covering insulating region encapsulating the insulated gates to allow electrical contact to the insulated gates of the IGFETs.

SUMMARY OF THE INVENTION

It is an aim of the present invention to provide a semiconductor device and a method of manufacturing a semiconductor device which enables electrical contact to be made to an encapsulated electrically conductive region, which may be an insulated gate, without the necessity of forming a separate contact hole or window through the covering insulating region to expose a contact area of the electrically conductive region, and which may be compatible with a double polycrystalline silicon bipolar technology and so may, but need not necessarily, be used in a BICMOS process using such double polycrystalline silicon layer technology.

According to one aspect of the present invention, there is provided a semiconductor device comprising a semiconductor body having a first major surface and defining at least one active device, an electrically conductive region provided on the first major surface, a covering insulating region encapsulating the electrically conductive region, and a conductive track provided on the first major surface so as to make electrical contact with the electrically conductive region, characterised in that the conductive track is in electrical contact with a relatively highly doped semiconductor region formed within the semiconductor body adjacent the first major surface and in that an area of the electrically conductive region makes electrical contact with the relatively highly doped semiconductor region which provides a conductive path to establish the electrical contact between the conductive track and the electrically conductive region.

In another aspect, the present invention provides a method of manufacturing a semiconductor device, which method comprises providing a semiconductor body having a first major surface and defining at least one active device, providing an electrically conductive region on the first major surface, encapsulating the electrically conductive region within an insulating covering region, and providing a conductive track on the first major surface so as to make electrical contact with the electrically conductive region, characterised by forming a relatively highly doped semiconductor region within the semiconductor body adjacent the first major surface, providing the conductive track so that the conductive track is in electrical contact with the relatively highly doped semiconductor region, and providing the electrically conductive region so that an area of the electrically conductive region makes electrical contact with the relatively highly doped semiconductor region which provides a conductive path to establish the electrical contact between the conductive track and the electrically conductive region.

Thus the present invention enables electrical contact to be made to an electrically conductive region encapsulated by a covering insulating region by bringing an area of the electrically conductive region into electrical contact with a highly doped semiconductor region which is provided adjacent the first major surface and which provides a conductive path to the conductive track. It is thus not necessary to form a contact hole or window through the covering insulating region to enable electrical contact to be made to the electrically conductive region.

Preferably, the electrically conductive region is provided on an insulating region formed on the first major surface and the area of the electrically conductive region extends beyond the insulating region to make electrical contact with the relatively highly doped semiconductor region. In a preferred embodiment, the electrically conductive region forms the gate conductive region and the insulating region forms the gate insulating region of the insulated gate of at least one insulated gate field effect transistor. With such an arrangement, because the insulated gate is encapsulated by an electrically isolating covering insulating region and it is not necessary to enable contact to be made to the insulated gate via the covering insulating region, it is possible for other electrical connections to extend onto and over the encapsulated insulated gate without undesired electrical shorts. This should enable higher packing densities to be achieved.

The electrically conductive region may be formed by a doped layer. The semiconductor body may define at least one bipolar transistor, in which case the doped layer forming the electrically conductive region may also define at least one other doped polycrystalline silicon region for forming at least part of the base region of at least one bipolar transistor. The doped layer may define other doped regions for providing, for example, at least part of the base region of at least one complementary conductivity type bipolar transistor. Complementary type IGFETs (CMOS) may also be provided in which case the electrically conductive region may form the gate conductive region of at least one of the IGFETS. The doped layer forming the electrically conductive region may be a doped polycrystalline silicon region or may be formed, for example, of another dopable material.

The conductive track may be formed by a doped layer which may be provided with a more highly electrically conductive surface region. The doped layer forming the conductive track may be a doped polycrystalline silicon layer in which case the more highly electrically conductive region may be a metal silicide surface region provided in, for example, a self-aligned manner. Where the semiconductor body defines at least one bipolar transistor, the doped layer forming the conductive track may define at least one additional doped region for forming at least part of the emitter region of the bipolar transistor. Where complementary bipolar transistors are to be provided, then this doped layer may also define complementarily doped regions for forming at least part of the emitter regions of the complementary bipolar transistors.

A technology can thus be provided which enables the use of encapsulated gates so allowing overlapping source and drain contact holes as described above which enables increased packing density and which provides, by way of the doped layer providing the conductive track, an additional electrically conductive layer for enabling electrical interconnection.

The doped layer forming the conductive track may also define doped regions for forming contact regions for source and drain regions of at least one IGFET, for example for the complementary IGFETs used within a BICMOS technology.

Where the semiconductor body defines a circuit having at least two insulated gate field effect transistors, the doped layer forming the conductive track may also define doped regions providing connections between the insulated gate field effect transistors. Thus, in a preferred example, the doped layer forming the conductive track may also provide doped regions for forming contact regions to the source and drain regions of the IGFETs and for providing interconnections between the IGFETS. Accordingly, the local interconnections of the IGFETs may be provided entirely by the doped layer forming the conductive track so that metallisation contacts need only be provided at the periphery of the circuit, away from the actual device structures. Of course, the amount or area of circuit which can be interconnected by the use of this doped layer will depend on the desired operating characteristics of the circuit but for circuits with relatively low frequency requirements then the connections of quite large circuit areas may be formed in this manner with the metallisation contacts being provided only at the periphery of the circuit area. This feature, in conjunction with the fact that the present invention allows the doped layer forming the conductive track to overlap onto or even cross the insulated gates of the IGFETS, should enable very high packing densities to be achieved and also provides a technology which is particularly well adapted to computer aided design (CAD). In the case of a BICMOS process embodying the invention, the emitter regions of the bipolar devices can also be formed, with appropriate mask modification, from the doped layer providing the conductive track and the local interconnections in the CMOS circuitry, without the need for additional masking steps.

BRIEF DESCRIPTION OF THE DRAWING

Embodiments of the invention will now be described, by way of example, with reference to the accompanying drawings, in which.

Figure 1:
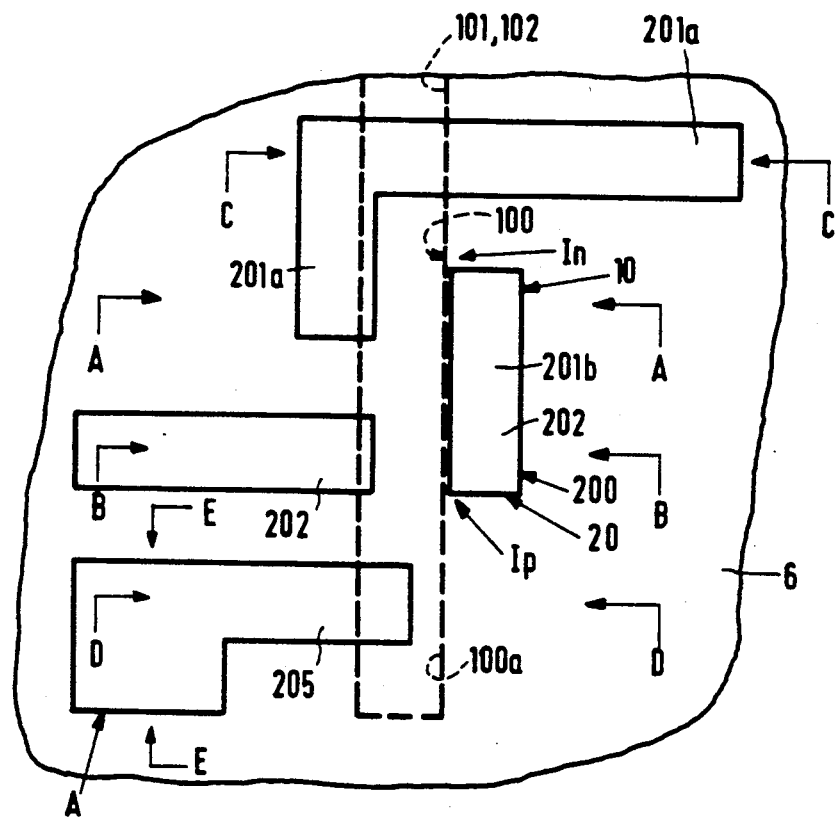
FIG. 1 is a schematic plan view of lateral complementary IGFETs embodying the invention and connected as an inverter arrangement showing the layout of doped polycrystalline silicon regions of first and second polycrystalline silicon layers of the complementary IGFETs.

It should be understood that the Figures are merely schematic and are not drawn to scale. In particular, certain dimensions such as the thickness of layers or regions may have been exaggerated whilst other dimensions may have been reduced. It should also be understood that the same reference numerals are used throughout the Figures to indicate the same or similar parts.

DESCRIPTION OF THE PREFERRED EMBODIMENTS

Referring now to the drawings (for example FIGS. 1, 1a and 2a to 2e), there is illustrated a semiconductor device comprising a semiconductor body 1 having a first major surface 2 and defining at least one active device (in the example shown in FIGS. 1, 1a and 2 complementary n and p channel IGFETs 10 and 20 connected in an inverter arrangement), an electrically conductive region 101,102 provided on the first major surface 2 and a covering insulating region 300,400 encapsulating the electrically conductive region 101,102, and a conductive track 205 provided on the first major surface 2 so as to make electrical contact with the electrically conductive region 101,102.

In accordance with the invention, the conductive track 205 is in electrical contact with a relatively highly doped semiconductor region 50 (FIG. 2d) formed within the semiconductor body adjacent the first major surface 2 and an area 100a of the electrically conductive region 101,102 makes electrical contact with the relatively highly doped semiconductor region 50 which provides a conductive path to establish electrical contact between the conductive track 205 and the electrically conductive region 101,102.

Thus, electrical contact is made to the encapsulated electrically conductive region 101,102 without the necessity of forming a contact hole or window through the covering insulating region 300,400 to enable electrical contact to be made to the electrically conductive region 101,102.

In the examples to be described below, the electrically conductive region 101,102 is provided on an insulating region 12,22 formed on the first major surface 2 and the area 100a of the electrically conductive region 101,102 extends beyond the insulating region 12,22 to make electrical contact with the relatively highly doped semiconductor region 50. In these examples, the electrically conductive region 101,102 forms the gate conductive region and the insulating region 12,22 forms the gate insulating region of the insulated gate 11,21 of at least one insulated gate field effect transistor (IGFETs 10,20). With such an arrangement, because the insulated gate 11,21 is encapsulated by an electrically isolating covering insulating region 300,400 and it is not necessary to enable contact to be made to the insulated gate 11,21 via the covering insulating region 300,400, it is possible for other electrical connections to extend onto and over the encapsulated insulated gate 11,21 without undesired electrical shorts which should enable higher packing densities to be achieved.

Figure 2A:
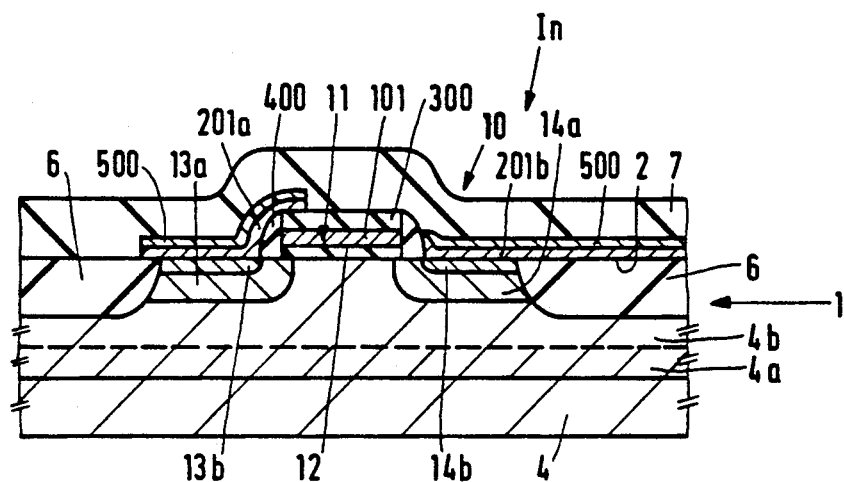
FIGS. 2a to 2e are cross-sectional views taken along respective lines a—a, b—b, c—c, d—d and e—e of the lateral IGFETs illustrated in FIG. 1.
Figure 2B:
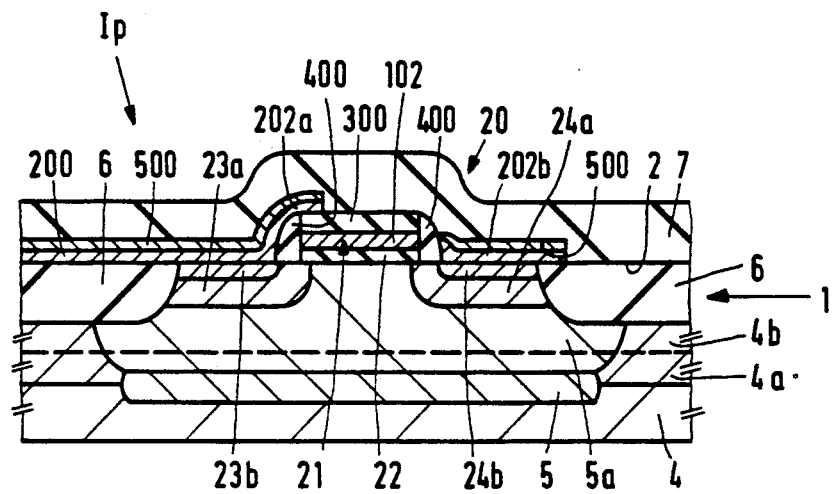

Referring now to the specific example shown in FIGS. 1 and 2, the cross-sectional view shown in FIG. 2a and taken along the line A—A in FIG. 1 illustrates the n channel IGFET 10 whilst the cross-sectional view shown in FIG. 2b and taken along the line B—B in FIG. 1 shows the p channel IGFET 20. FIGS. 2c,2d and 2e are cross-sectional views taken along the lines C—C and D—D and E—E, respectively, in FIG. 1.

The semiconductor body 1 comprises, in this example, a monocrystalline silicon substrate 4 of p conductivity type. A relatively highly doped n conductivity type region 5 is provided by conventional masking and dopant introduction techniques in the area Ip (FIG. 2b) in which the p channel IGFET 20 is formed. Again using any suitable conventional techniques a layer 4a,4b of p conductivity type monocrystalline silicon is then provided. In this particular example, a layer 4a of relatively highly doped p conductivity type silicon is formed by dopant introduction, usually ion implantation, and a layer 4b of more lowly doped p conductivity silicon is epitaxially grown onto the layer 4a. If desired, however, the more highly doped layer 4a may be omitted. As shown in FIG. 2b, a relatively lowly doped n conductivity type well region 5a is provided above and meeting the buried region 5 and the areas In and Ip of the respective IGFETs 10 and 20 are defined by a field oxide pattern 6 formed using conventional local oxidation of silicon techniques.

The insulated gates 11 and 21 are then defined. The gate insulating region 12,22 is provided in conventional manner as a thermal oxide layer grown on the first major surface 2 and patterned so as to remove the thermal oxide where it is not required. The gate conductive regions 101,102 are then provided by depositing, using conventional CVD techniques, a first polycrystalline silicon layer 100 (FIG. 1) which is doped either during or subsequent to deposition with, in this example, n conductivity type impurities, for example phosphorus ions.

An oxide layer is then provided by conventional means on the doped polycrystalline silicon layer and the two layers then patterned to define the desired gate conductive regions 101 and 102 each having a covering or capping oxide region 300. In the example shown in plan view in FIG. 1, two complementary IGFETs 10 and 20 are provided with the insulated gates 11 and 21 connected together to provide the inverter circuit structure shown in FIG. 1a, that is the doped polycrystalline silicon is patterned so as to define a continuous doped region for the gate conductive regions 101,102. Outside the areas of the insulated gates 11,21, the majority of the first doped polycrystalline silicon layer 100 extends over the field oxide pattern 6 as shown in FIGS. 2c and 2e. However, an area 100a of the first doped polycrystalline silicon layer 100 extends beyond the gate insulating regions 12,22 onto an area 2a of the first major surface 2 from which the thermal oxide has been removed as illustrated in FIG. 2d.

After definition of the first doped polycrystalline silicon layer 100 to define the insulated gates 11 and 21, impurities are introduced using the insulated gates 11 and 21, capping oxide layer 300 and field oxide pattern 6 as a mask to form the lowly doped regions 13a, 14a, 23a, 24a of the source drain regions of the IGFETs 10 and 20 and a relatively doped region 50b of the semiconductor region 50 with, of course, the area In of the n channel IGFET 10 and the area A being masked during the introduction of the p conductivity type impurities to form the lowly doped source and drain regions 23a and 24a of the p channel IGFET 20 and vice versa.

A further layer of oxide is then deposited and etched using conventional anisotropic etching techniques to leave oxide spacer regions 400 on the side walls of the insulated gates 11,21. Thus, as can be seen clearly from FIGS. 2a to 2d, the doped polycrystalline silicon layer 100, in particular the insulated gates 11,21, is encapsulated and thus electrically isolated by the capping oxide region 300 and spacer regions 400 which together form the covering insulating region.

Further polycrystalline silicon is then deposited and patterned using conventional masking techniques to define the desired regions of a second polycrystalline silicon layer 200. Using conventional masking techniques, the further polycrystalline silicon at the area Ip is doped with p conductivity type impurities to form p conductivity type polycrystalline silicon contact regions 202a and 202b (FIG. 2b) on the source and drain regions 23 and 24 at the areas Ip where the p channel IGFET is being defined whilst the further polycrystalline silicon at the areas In and A is doped with n conductivity type impurities to define n conductivity type polycrystalline silicon contact regions 201a and 201b on the source and drain regions 13 and 14 (FIG. 2a) of the n channel IGFET 10 and the n conductivity polycrystalline silicon track 205 at area A (FIGS. 2d and 2).

A layer of a siliciding metal, in this example titanium although other suitable metals could be used, is then deposited onto the second doped polycrystalline silicon layer 200. The semiconductor body 1 is then subjected to a rapid thermal annealing treatment which causes formation of a metal silicide surface region 500 on the second doped polycrystalline silicon layer 200. The unreacted titanium is then selectively removed.

Conventional high temperature processing steps are used to cause impurities to diffuse out of the second doped polycrystalline silicon layer 200 to form, as shown in FIGS. 2a and 2b, relatively highly doped regions 13b, 14b, 23b, 24b of the source and drain regions 13, 14, 23, 24 of the IGFETs 10 and 20 and, as shown in FIG. 2d a relatively highly doped portion 50c of the semiconductor region 50.

Such high temperature processing or heat treatment also results in diffusion of impurities out of the area 100a of the first polycrystalline silicon layer 100 into the semiconductor body 1 to form a relatively highly doped n conductivity type portion 50a which together with a relatively lowly doped n conductivity type portion 50b formed with the relatively lowly doped source and drain regions 13a, 14a and the relatively highly doped portion 50c formed by diffusion of impurities out of the second doped polycrystalline silicon layer 200 provides the relatively highly doped region 50 forming, as is evident from FIG. 2d, a conductive path between the insulated gates 11,21 and the conductive track 205 formed by part of the second polycrystalline silicon layer 200 covered by a metal silicide surface region 500. The conductive track 205 extends, as illustrated by FIGS. 1 and 2e, onto the field oxide pattern 6.

As shown in, for example, FIGS. 2a and 2b, the patterning, by conventional means, of the second polycrystalline silicon layer to define the desired polycrystalline silicon regions is such that the final doped polycrystalline silicon regions 201a, 201b, 202a and 202b, for example, completely cover the respective source and drain regions 13,14,23 and 24 and indeed overlap slightly onto the encapsulated insulated gates 11 and 21 in addition to extending onto the field oxide 6. It is however possible, because of mask mis-alignment or other problems, that the patterned polycrystalline silicon regions may not extend as far as the insulated gates 11,21 so that an area of the first major surface 2 is exposed between the spacer region 400 and the polycrystalline silicon region 201a, 201b, 202a or 202b. Such a misalignment may even result in a slight etching of the exposed area to form a pit or recess in the source or drain region 13,14,23 or 24. However because in the example described above the doping, conveniently by ion implantation, of the polycrystalline silicon regions to form the doped polycrystalline regions 201a, 201b, 202a and 202b and the conductive track 205 is carried out after the patterning of the second polycrystalline silicon layer, impurites are also introduced into such an exposed area or pit of the source or drain region during the doping of the polycrystalline silicon so that the continuity of the relatively highly doped regions 13b,14b,23b and 24b and their alignment with the respective encapsulated insulated gates 11 and 21 is assured.

A final insulating layer 7 again, for example silicon dioxide deposited by CVD, is provided over the structure as shown in FIGS. 2a to 2e. Contact windows are then opened in the final insulating layer 7 to enable subsequent metallisation (not shown) to provide electrical connections, as desired, to the device regions.

As illustrated most clearly by FIG. 1 and FIGS. 2d and 2e, electrical contact to the insulated gates 11 and 21 is formed via the relatively highly conductive semiconductor region 50 and the conductive track 205 which extends onto the field oxide. Accordingly, the contact window 70 (FIG. 2e) for enabling the subsequent metallisation (not shown) to make electrical contact to the insulated gates 11 and 21 is provided at a position remote from the circuit structure. Thus, it is not necessary to open contact windows through the capping oxide region 300 to make electrical connection directly on top of the insulated gates 11 and 21. This enables, the doped polycrystalline silicon regions contacting the source and drain regions of the IGFETs to cross over the insulated gates, where desired, without causing undesired electrical shorts. Thus, as illustrated in FIG. 1, the doped polycrystalline silicon region 201a contacting the source region 13 of the n-channel IGFET 10 extends over the insulated gate 11 onto the field oxide on the other side of the insulated gate 11.

As will be appreciated from, in particular FIG. 1, the use of the silicided second doped polycrystalline silicon layer 200 to contact the source, drain and insulated gates of the IGFETs 10 and 20 enables the contact windows for allowing contact of the source and drain regions to subsequent metallisation, for example aluminium deposited in conventional manner, to be positioned at the periphery of the circuit, generally on the field oxide pattern 6 in a manner similar to that shown in FIG. 2e for the electrical connection to the conductive track 205 and the manner in which the insulated spacer regions 400 are defined enables the second doped polycrystalline silicon layer 200 to contact the source and drain regions 13,14,23 and 24 without the necessity for opening contact windows through the insulating layer 300,400. This, in combination with the fact that the second doped polycrystalline silicon layer 200 can cross over the encapsulated insulated gates 11 and 21, allows a higher packing density to be achieved and also provides a technology which is particularly well adapted to computer aided design.

Figure 1A:
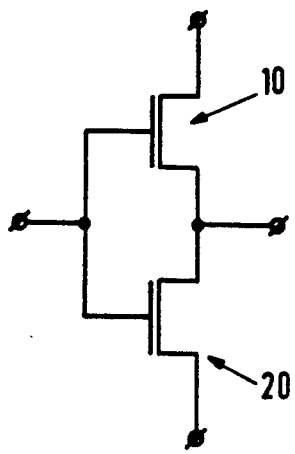
FIG. 1a is a circuit diagram for FIG. 1.
Figure 2C:
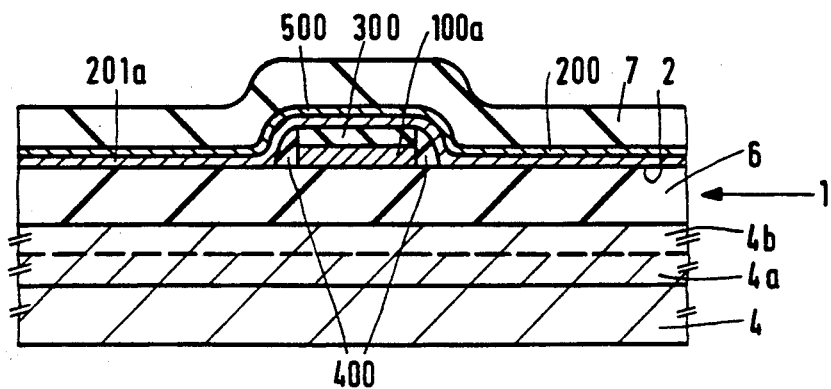
Figure 2D:
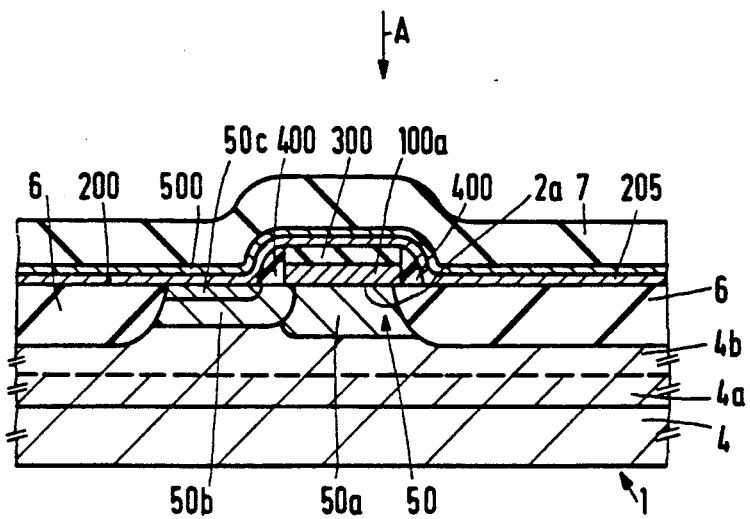
Figure 2E:
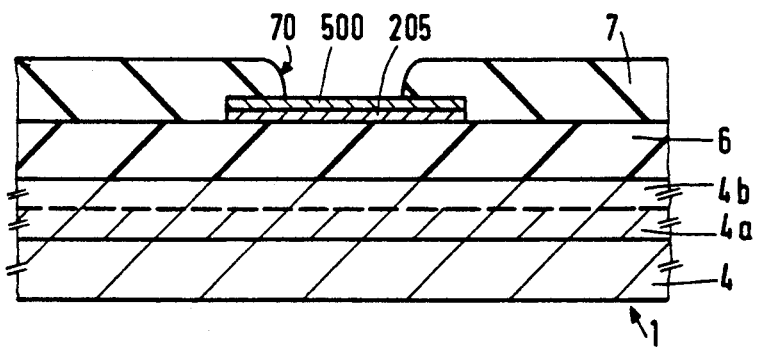
Figure 3A:
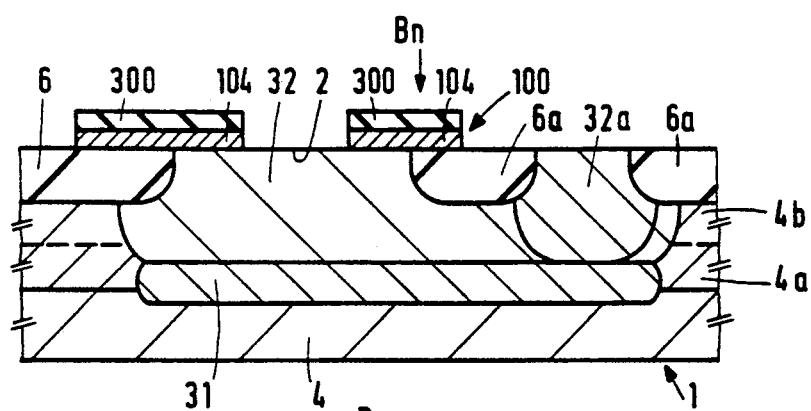
FIGS. 3a to 3e are cross-sectional views illustrating different parts of a semiconductor body and showing a stage in the manufacture of a semiconductor device in accordance with the invention having complementary bipolar transistors (FIGS. 3a and 3b) and complementary IGFETs (FIGS. 3c and 3d)
Figure 3B:
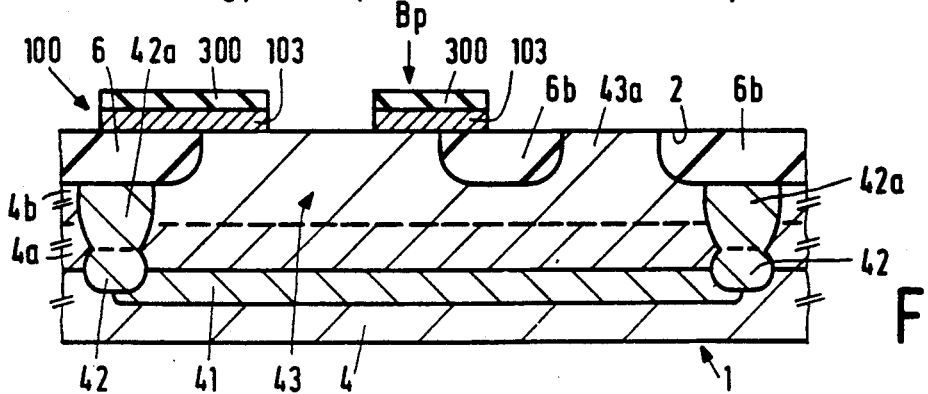
Figure 3C:
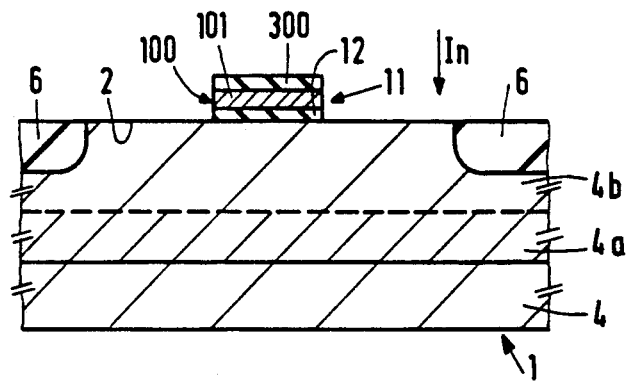
Figure 3D:
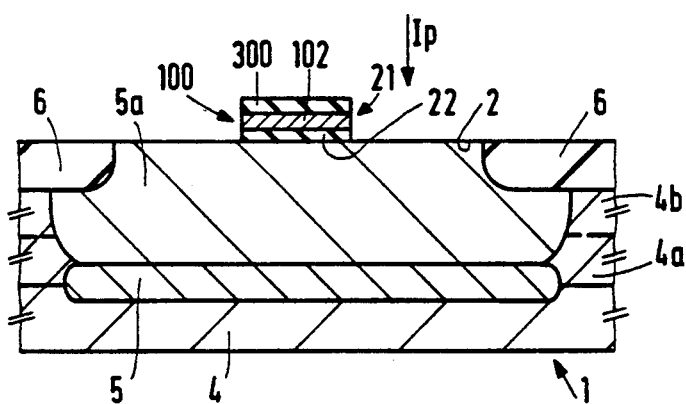
Figure 3E:
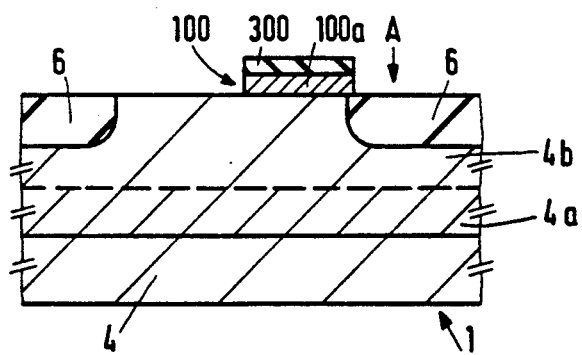
Figure 4A:
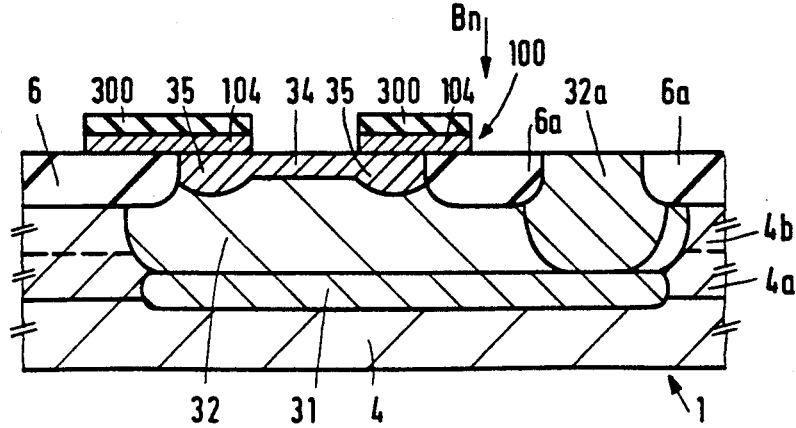
FIG. 4a to 4e are cross-sectional views similar to the corresponding ones of FIGS. 3a to 3e and illustrating a further stage in the manufacture of the semiconductor device.
Figure 4B:
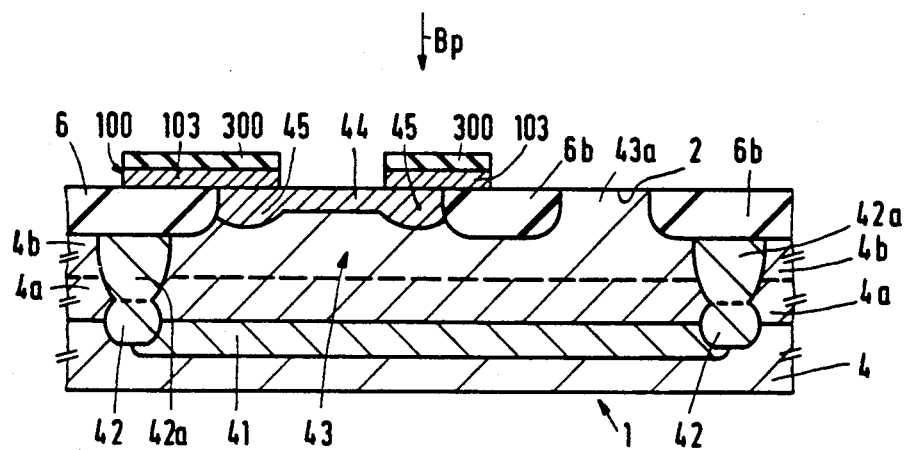
Figure 4C:
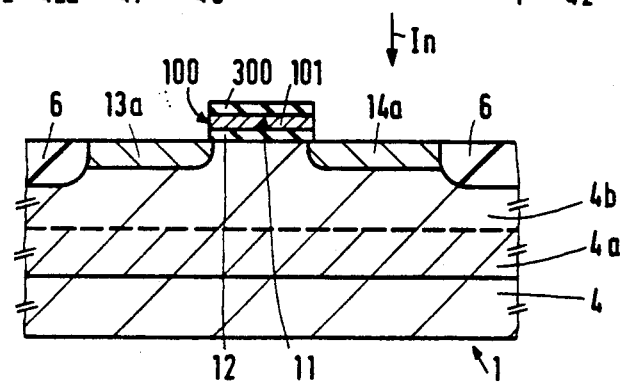
Figure 4D:
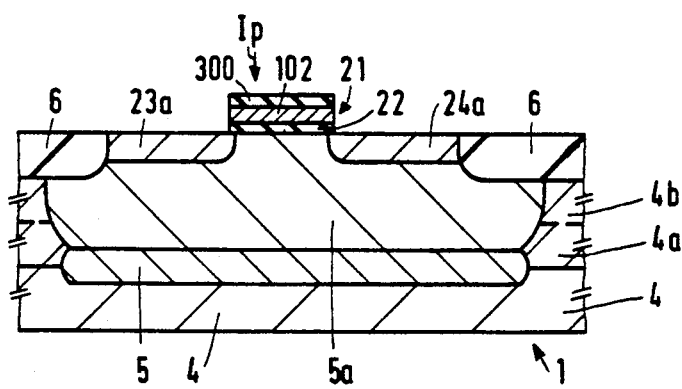
Figure 4E:
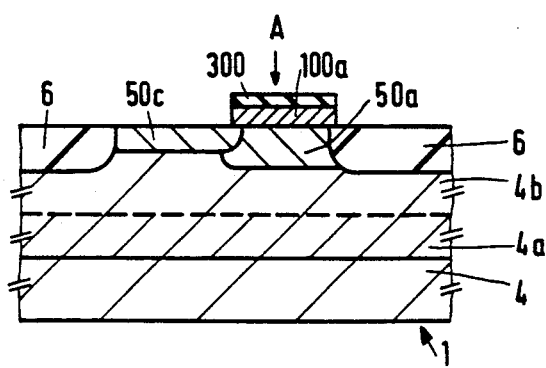
Figure 5A:
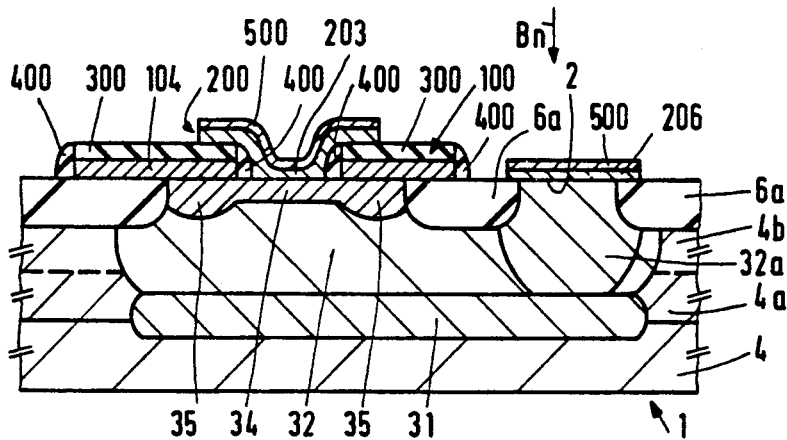
FIGS. 5a to 5e are cross-sectional views similar to the corresponding ones of FIGS. 4a to 4e but illustrating a later stage in the manufacture of the semiconductor device.
Figure 5B:
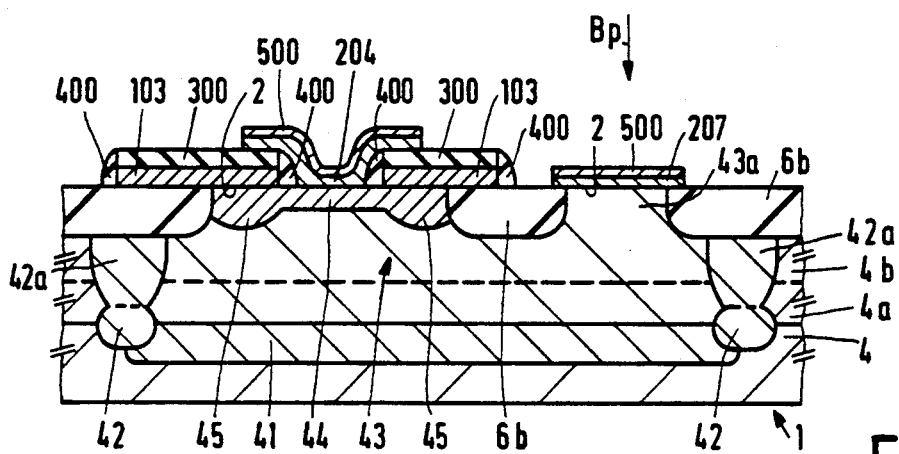
Figure 5C:
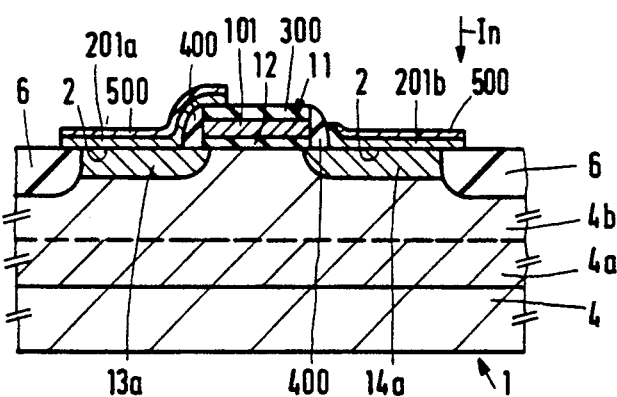
Figure 5D:
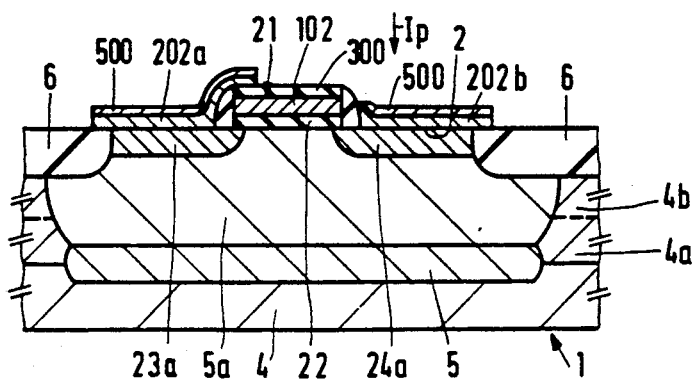
Figure 5E:
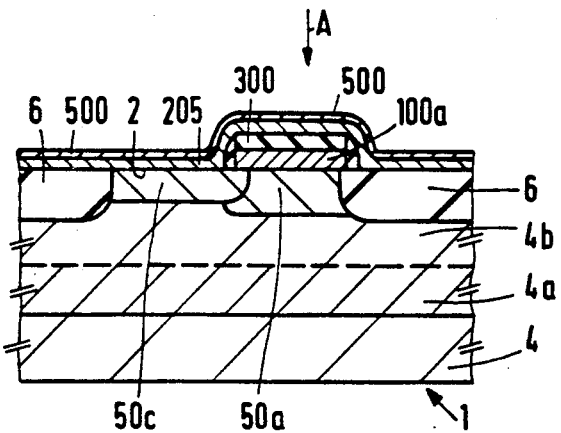

Although FIG. 1 shows a relatively simple circuit consisting of only IGFETs 10 and 20 connected in the inverter arrangement illustrated in FIG. 1a, the second doped polycrystalline silicon layer 200 may be used to provide interconnections between more IGFETS. Thus, for example, more complicated circuits consisting of many IGFETS, may be provided in which the desired circuit interconnections between the IGFETs are formed entirely by the second doped polycrystalline silicon layer 200 with the contact windows for the subsequent metallisation being provided at the periphery of the device, normally on the field oxide.

Of course, although FIG. 1 shows the insulated gates 11 and 21 of the IGFETs 10 and 20 connected this need not necessarily be the case but will depend upon the desired function of the circuit.

It will, of course, be appreciated that any desired interconnection can be provided between the first and second doped polycrystalline silicon layers 100 and 200 simply by appropriate patterning of these layers and of the field oxide pattern 6 and gate insulating regions 12,22. Thus, for example, where desired a source or drain region of an IGFET may be connected to its respective insulated gate simply by providing a continuous doped region of the second polycrystalline silicon layer 200 between the conductive track 205 and the source or drain region, as required.

Although the method and structure described above can be applied in any suitable circumstances where connection is required to an encapsulated electrically conductive region such as an insulated gate as in the example described above or, for example, a conductive track, the method and structure described above are particularly suited to use within a process where a double polycrystalline silicon layer technology is used to form one or more bipolar transistors in addition to an insulated gate device such as an IGFET. That is to, for example, a so-called BICMOS technology in which bipolar transistors are formed with IGFETs.

A method of manufacturing a BICMOS type of device will now be described, by way of example, with reference to FIGS. 3 to 6 which illustrate successive stages in the manufacture. Each of FIGS. 3 to 6 is divided into five sections, a to e, each illustrating a given area of the semiconductor device. Thus FIGS. 3a, 4a, 5a and 6a illustrate the area Bn in which an npn bipolar transistor 30 is being formed, FIGS. 3b, 4b, 5b and 6b illustate the area Bp in which a pnp bipolar transistor 40 is being formed, FIGS. 3c, 4c, 5c and 6c the area In in which an n-channel transistor 10 is being formed, FIGS. 3d, 4d, 5d and 6d the area Ip in which a p-channel transistor 20 is being formed and FIGS. 3e, 4e, 5e and 6e the area A in which connection to an insulated gate is established in a manner similar to that described above with reference to FIGS. 1 and 2. Insofar as the IGFETs being manufactured in the process to be described below are similar to those shown in FIGS. 1 and 2, the same reference numerals are used.

Referring now to FIGS. 3a to 3e, the semiconductor body 1 again comprises a monocrystalline silicon substrate 4 doped with impurities of the opposite conductivity type, p conductivity type in this case, to provide a resistivity of typically 10 ohm-cm. Impurities of the one conductivity type, n conductivity type in this case, are introduced into the substrate 4 using an appropriate mask to form at the area Bn a relatively highly doped region 31 which will eventually form part of the collector region, at the area Bp a relatively lowly doped region 41 and a relatively highly doped bounding region 42 and at the area Ip a relatively highly doped region 5 which will form part of the well region for the p channel IGFET 20.

In this example, as in the example described above with reference to FIGS. 2a to 2e a first relatively highly doped p+ conductivity type layer 4a is formed by dopant introduction, usually ion implantation, onto which a more lowly doped p conductivity type epitaxial layer 4b is grown to bury the regions 31,41,42 and 5. Again, the relatively highly doped layer 4a may be omitted, if desired.

Using conventional photolithographic and etching techniques, a mask layer (not shown) is then defined and impurities are introduced, in this case phosphorus ions are implanted, to form at the area Bn a relatively lowly doped n conductivity type collector region 32 and at the area Ip a relatively lowly doped well region 5a for the IGFET 20. In addition, a relatively highly doped region 42a is formed at the area Bp to complete the n conductivity type isolation surrounding the p conductivity type collector region 43 of the pnp bipolar transistor 40. As will be appreciated, the collector region 43 is formed by portions of the p conductivity type epitaxial layers 4a,4b.

The respective device areas Bn, Bp, In, Ip and A and any other device areas (not shown) of the semiconductor body 1 are defined or separated from one another by forming a field oxide pattern 6 using, for example, conventional local oxidation of silicon techniques with a silicon oxide-silicon nitride mask (not shown).

Various threshold adjustment implantations may be carried out if necessary for the IGFETS. Also, although not shown, highly doped channel stopper regions may be provided beneath the field oxide pattern 6 by ion implantation before formation of the field oxide pattern 6. As is evident from FIG. 3, in addition to defining the device areas Bn, Bp, In, Ip and A, areas 6a of the field oxide pattern serve to define at the area Bn a collector contact area 32a which is doped twice with impurities of the one conductivity type, once during formation of the lowly doped collector region 32 and once through an appropriate mask, to enable ohmic contact to the collector region. Areas 6b of the field oxide pattern similarly define at the area Bp a collector contact area 43a for the pnp transistor 40.

After usual conventional surface cleaning treatments a thin layer of oxide is thermally grown on the first major surface 2 and then patterned using conventional techniques to provide the gate insulating regions 12,22 at the areas In and Ip.

Polycrystalline silicon is then deposited using conventional chemical vapour deposition (CVD) techniques to a thickness of about 500 nm (nanometres). A masking layer (not shown) is then provided over the deposited polycrystalline silicon layer to mask the area Bn and n conductivity type impurities, in this example phosphorus ions, with, typically, an energy of 50 keV and dose of $2 \times 10^{16}$ cm$^{-2}$ areimplanted through the mask to define the n conductivity type gate conductive regions 101 and 102 and also n conductivity type polycrystalline silicon regions 103 at the area Bp for forming, as will become evident below, the extrinsic base region of the pnp bipolar transistor 40. The masking layer is then removed and p conductivity type impurities, in this example boron ions with an energy of 30 keV and a dose of $3 \times 10^{15}$ cm$^{-2}$, implanted to cause the previously undoped polycrystalline silicon to become p conductivity type to provide at the area Bn the p conductivity type polycrystalline silicon region 104 for forming the extrinisic base region of the npn bipolar transistor 30. The dose used is insufficient to overdope the n conductivity type polycrystalline silicon regions 101, 102 and 103 which thus remain n type.

Although in this example n conductivity type impurities are used to render the gate conductive regions 101 and 102 conductive, p conductivity type impurities could be used with appropriate other dopant modifications, where necessary.

A layer of silicon oxide, for example TEOS (tetraethylorthosilicate), is then deposited to a thickness of about 300 nm on the polycrystalline silicon layer and then the silicon oxide layer and underlying polycrystalline silicon are then etched via an appropriate mask and using conventional techniques to define the doped polycrystalline silicon layer 100 and the covering capping oxide layer 300 as shown in FIG. 3a to 3e.

The areas Bn and Ip are then masked and impurities of the one conductivity type, n conductivity type in this example, introduced using the doped polycrystalline silicon layer 100, capping oxide layer 300 and field oxide pattern 6 as a mask to define the relatively lowly doped source and drain regions 13a and 14a of the IGFET 10 at the area In, the intrinsic base region 44 of the pnp bipolar transistor 40 and the relatively lowly doped region 50b of the highly doped region 50 which provides the conductive path from the area 100a of the insulated gates 11,21 to the conductive track 205. After removal of this mask, the areas Bp, In and A are then masked and p conductivity type impurities introduced to form at the areas Ip and Bn, respectively, the relatively lowly doped source and drain regions 23a and 24a of the p channel IGFET 20 and the intrinsic base region 34 of the npn bipolar transistor 30. During a subsequent annealing treatment, impurities are caused to diffuse out of the doped polycrystalline silicon layer 100 into the underlying silicon to form the extrinsic base regions 35 and 45 of the bipolar transistors 30 and 40 and to provide the relatively highly doped region 50a at the area A as shown in FIGS. 4a to 4e.

A further layer of silicon oxide, again in this example a TEOS layer, is then deposited over the surface structure at the first major surface 2 and etched anisotropically using conventional techniques to leave insulating spacer regions 400 on the side walls of the doped polycrystalline silicon layer 100. Thus, as shown in FIGS. 5a to 5e, the doped polycrystlline silicon layer 100, including the insulated gates 11,12, is completely encapsulated and thus electrically isolated by the covering insulating region defined by the capping insulating layer 300 and the insulating spacer regions 400.

A second layer of polycrystalline silicon is then deposited and patterned using conventional photolithographic and etching techniques to define the regions of the polycrystalline silicon which form the polycrystalline silicon layer 200. A masking layer is then provided to cover the areas Bp and Ip and n conductivity impurities introduced using the masking layer (not shown), field oxide pattern 6 and capping oxide regions 300 as a mask so as to form a highly n conductivity type doped polycrystalline silicon region 203 within the emitter window at the area Bn, highly doped n conductivity type polycrystalline silicon contact regions 201a and 20b over the source and drain regions 13 and 14, respectively, at the area In and a highly doped n conductivity type polycrystalline silicon region for forming the conductive track 205 at the area A. This masking layer is then removed and replaced by another masking layer which masks the areas Bn, In and A from p conductivity type impurities which are then introduced to form a p conductivity type doped polycrystalline silicon region 204 in the emitter window at the area Bp and p conductivity type doped polycrystalline silicon contact regions 202a and 202b covering the source and drain regions 23 and 24, respectively, at the area Ip.

After removal of this masking layer, a siliciding metal, for example titanium, is deposited to a thickness of about 30 nm, for example using conventional sputtering techniques, and is subjected to a rapid thermal anneal (RTA) to form a titanium silicide surface region 500 on the second doped polycrystalline silicon layer 200. The unreacted titanium is then selectively removed from the oxide regions to leave the structure shown in FIGS. 5a to 5e.

An insulating layer 7 is then provided over the surface structure. The insulating layer 7 may again be a TEOS layer. The insulating layer 7 is planarised using known techniques, for example by applying a flowable medium such as a resist or a glass (e.g. Borophosphosilicate glass (BPSG) and then etching the insulating layers with an etchant which etches the TEOS layer 7 at the same rate as the resist or BPSG layer.

The emitter regions 36 and 46 of the bipolar transistors 30 and 40, the relatively highly doped source and drain regions 13b, 14b, 23b and 24b of the IGFETs 10 and 20, highly doped collector contact regions 32b and 44a, and the relatively highly doped region 50c at area A are formed by diffusion of impurities out of the second doped polycrystalline silicon layer 200. Generally, this diffusion is caused by a dedicated high temperature processing step prior to the silicidation step mentioned above, although, of course, additional diffusion of impurities out of the second doped polycrystalline silicon layer 200 may occur during the silicidation and possibly also during the planarisation process discussed above.

As mentioned above it is possible, because of mask mis-alignment or other problems, that the patterned polycrystalline silicon regions may not extend as far as the insulated gates so that an area of the first major surface 2 is exposed between the spacer region 400 and the polycrystalline silicon region 201a,201b,202a or 202b. Such a misalignment may even result in a slight etching of the exposed area to form a pit or recess in the source or drain region 13,14,23 or 24. However because in the example described above the doping, conveniently by ion implantation, of the polycrystalline silicon regions to form the doped polycrystalline regions 201a,201b,202a and 202b and the conductive track 205 is carried out after the patterning of the second polycrystalline silicon layer, impurities are also introduced into such an exposed area or pit of the source or drain region during the doping of the polycrystalline silicon so that the continuity of the relatively higher doped regions 13b,14b,23b and 24b and their alignment with the respective encapsulated insulated gates 11 and 21 is assured.

Figure 6A:
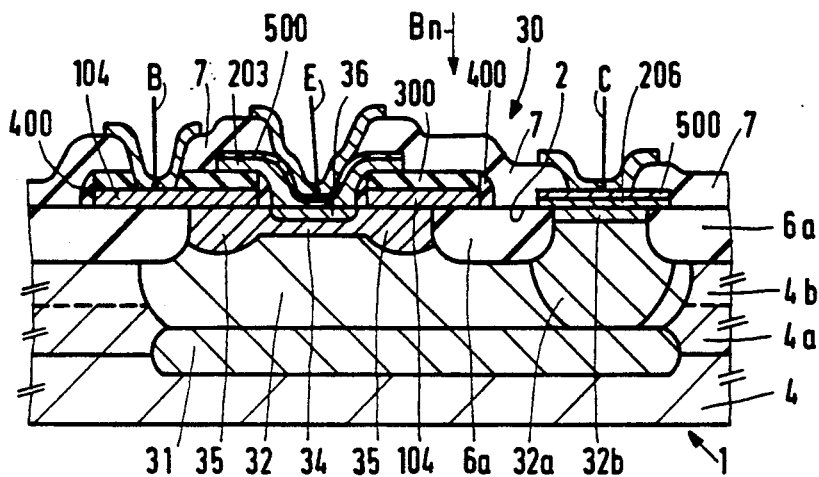
FIGS. 6a to 6e are cross-sectional views similar to the corresponding ones of FIGS. 5a to 5e but illustrating a further stage in the manufacture of the semiconductor device.
Figure 6B:
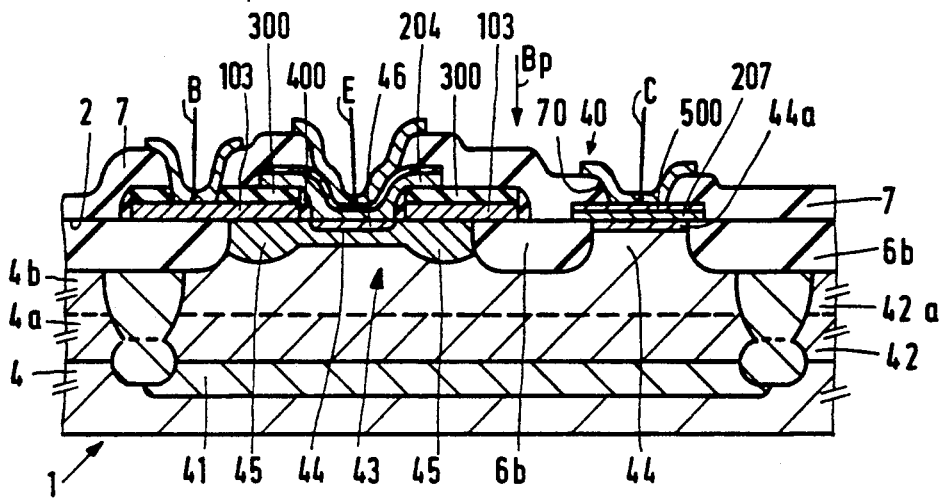
Figure 6C:
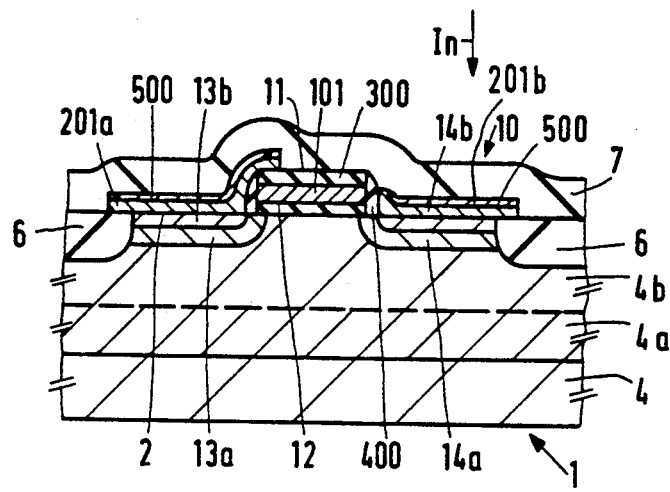
Figure 6D:
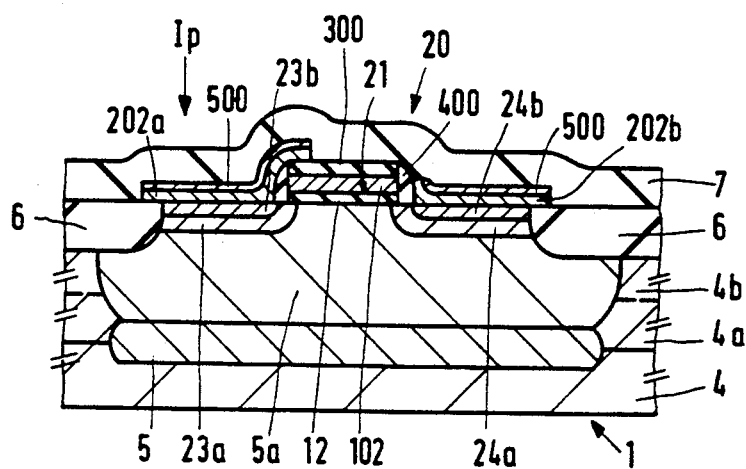
Figure 6E:
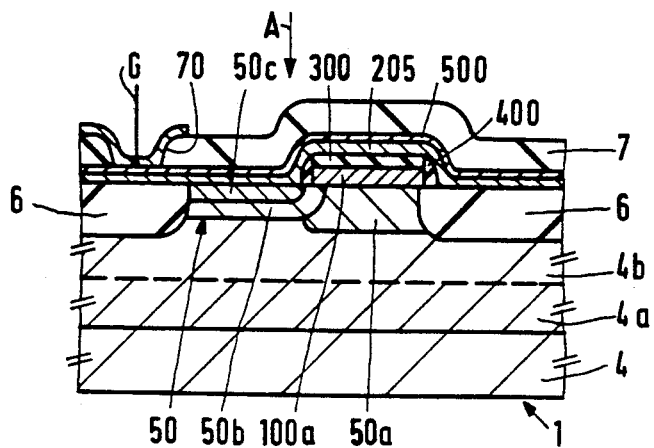

A contact window mask (not shown) is then provided on the planarised insulating layer 7 and contact windows 70 opened to enable electrical connection by subsequent metallisation to the various device regions. As illustrated in FIGS. 6a and 6b, the contact windows 70 for the npn and pnp bipolar transistors 30 and 40 are formed over the respective device regions so that, as shown, the base contacts B contact the respective ones of the doped polycrystalline silicon regions 104 and 103 from which the extrinsic base regions 35 and 45 are formed, the emitter contacts E contact the doped polycrystalline silicon regions 203 and 204 from which the emitter regions 36 and 46, respectively, are formed and the collector contacts C contact the doped polycrystalline silicon regions 206 and 207 provided on the collector contact regions 32b and 44a. Electrical contact of the source, drain and insulated gates of the IGFETs 10 and 20 to the subsequent metallisation is provided via the second doped layer 200. Thus, as shown in FIG. 6e, the metallisation contact G for the insulated gates 11 and 21 electrically contacts the conductive track 205 over the field oxide 6 via a window 70 opened in the insulating layer 7. As mentioned above, the semiconductor device region 50 provides an electrically conductive path between the conductive track 205 and the area 100a of the conductive gate regions 101 and 102 of the insulated gates 11 and 21. Although not shown in FIG. 6, the contact regions 201a, 201b, 202a and 202b provided by the second doped layer 200 at the source and drain region of the IGFETs may similarly extend onto the field oxide 6 where, although not shown, the metallisation makes the desired electrical connections via windows opened in the insulating layer 7 in a manner similar to that shown in FIG. 6e for the gate contact G. Interconnections between the IGFETs 10 and 20 to form, for example, the inverter circuit shown in FIG. 1a are similarly provided by the second doped layer 200.

As will be appreciated by those skilled in the art, the circuit formed using the above described BICMOS technology may consist of many bipolar transistors 30 and 40 and many IGFETs 10 and 20 connected to provide the desired circuit function. Generally, as will be evident from FIGS. 6a and 6b, the desired electrical connections between the bipolar transistors will be provided by suitable patterning of one or more levels of metallisation, in known manner. In contrast, as described above with reference to FIGS. 1,1a and 2a to 2e, desired electrical connections to and between the IG-FETs 10 and 20 are generally provided by the second doped polycrystalline silicon layer 200 and the subsequent metallisation makes appropriate connection to a CMOS circuit or a portion of a CMOS circuit at the periphery of the CMOS circuit over the field oxide pattern 6. It may also in certain circumstances be possible to provide interconnection between bipolar transistors within the second doped polycrystalline silicon layer 200.

The interconnections between the IGFETs forming the CMOS part or at least a portion of the CMOS part of the circuit are thus provided by the second doped polycrystalline silicon layer 200 and the second doped polycrystalline silicon layer 200 may cross over the encapsulated insulated gates 11 and 21. In addition, the manner in which the first doped layer 100 is encapsulated, that is the definiton of the capping region 300 with the first doped layer 100 and the formation of the spacer regions 400 by anistropic etching means that it is not necessary to open windows through an insulating layer to enable the second doped layer 200 to contact the source and drain regions of the IGFETs. These features enable the dimensions of the IGFETs and the spacings of the IGFETS to be reduced, allowing a higher packing density. Also, because it is not necessary to worry about routing connections around insulated gates, the technology is well adapted to computer aided design (CAD).

Of course, the amount or area of an IGFET circuit which can be interconnected by the use of the second doped layer will depend on the desired operating characteristics of the circuit but for circuits with relatively low frequency requirements then the connections of quite large circuit areas may be formed in this manner with the metallisation contacts being provided only at the periphery of the circuit area.

The first and second doped polycrystalline silicon layers 100,200 may, by appropriate patterning, also be used for other local interconnections for example to other devices, e.g. bipolar devices. In addition, it will be appreciated that the structure described above with reference to FIGS. 3 to 6 is merely an example of a BICMOS type of device and that, for example, the pnp transistors may be omitted. The present invention may also be applied to purely CMOS, NMOS or PMOS circuits. Also, the present invention may be applied in other circumstances where it is desired to make electrical contact to insulated gates which are encapsulated within covering insulating regions.

The first and second doped layers 100 and 200 may be formed of dopable materials other than polycrystalline silicon. Thus, for example, the polycrystalline silicon may be replaced by amorphous silicon. Also, where it is not desired for the first and second layers 100 and 200 to provide a source of dopants (in which case the highly doped region 50a will be formed by earlier dopant introduction) for the underlying semiconductor body, other electrically conductive materials could be used in place of the doped layers.

It will, of course, be appreciated that semiconductor materials other than silicon, for example a III-V material such as gallium arsenide, could be used.

From reading the present disclosure, other modifications and variations will be apparent to persons skilled in the art. Such modifications and variations may involve other features which are already known in the design and use of semiconductor devices and which may be used instead of or in addition to features already described herein.

I claim:

1. A semiconductor device comprising a semiconductor body having a first major surface and defining at least one insulated gate field effect transistor having source and drain regions formed within the semiconductor body adjacent the first major surface and an insulated gate provided on the first major surface so as to extend between the source and drain regions, the insulated gate comprising a gate conductive region formed on a gate insulating region provided on the first major surface and a covering insulating region encapsulating the gate conductive region, a conductive track being provided on the first major surface so as to be electrically isolated from the gate conductive region by the covering insulating region, a relatively highly doped semiconductor region being formed within the semiconductor body adjacent the first major surface so as to have first and second portions with the first portion being in electrical contact with the conductive track and an area of the gate conductive region extending beyond the gate insulating region down onto the first major surface so as to make electrical contact with the second portion of the doped semiconductor region for providing a conductive path between the conductive track and the gate conductive region through the first and second portions of the doped semiconductor region so as to establish electrical contact between the conductive track and the gate conductive region.

2. A semiconductor device according to claim 1, wherein the electrically conductive region is formed by a doped layer.

3. A semiconductor device according to claim 2, wherein the doped layer forming the electrically conductive region also defines at least one other doped region for forming at least part of the base region of at least one bipolar transistor.

4. A semiconductor device according to claim 1, wherein the conductive track is formed by a doped layer.

5. A semiconductor device according to claim 3, wherein the conductive track is formed by a doped layer which also defines at least one other doped region for forming at least part of the emitter region of the bipolar transistor. doped layer.

6. A semiconductor device according to claim 4, wherein the doped layer forming the conductive track also defines doped regions for forming contact regions for the source and drain regions of the insulated gate field effect transistor.

7. A semiconductor device according to claim 4, wherein the semiconductor body defines a circuit having at least two insulated gate field effect transistors and the doped layer forming the conductive track also defines doped regions providing connections between the insulated gate field effect transistors.

8. A semiconductor device according to claim 2, wherein the doped layer comprises a doped polycrystalline silicon layer.

9. A semiconductor device according to claim 4, wherein the doped layer forming the conductive track comprises a doped polycrystalline silicon layer having a metal silicide surface region.

10. A semiconductor device comprising a semiconductor body having a first major surface and defining at least one insulated gate field effect transistor having source and drain regions formed within the semiconductor body adjacent the first major surface and an insulated gate having a gate conductive region on a gate insulating region and being provided on the first major surface so as to extend between the source and drain regions, at least one bipolar transistor having emitter, base and collector regions, a first doped semiconductor layer having a first doped region provided on the gate insulating region to define the gate conductive region and a second doped region provided on the first major surface and doped with impurities of one conductivity type for forming at least part of the base region of the bipolar transistor, a covering insulating region encapsulating the gate conductive region, a second doped semiconductor layer having a first doped part defining a conductive track electrically isolated from the gate conductive region by the covering insulating region and a second doped part provided on the first major surface and doped with impurities of the opposite conductivity type for forming at least part of the emitter region of the bipolar transistor, a relatively highly doped semiconductor region formed within the semiconductor body adjacent the first major surface so as to have first and second portions, a part of the conductive track being in electrical contact with the first portion of the relatively highly doped semiconductor region and an area of the gate conductive region extending beyond the gate insulating region down onto the first major surface to provide at least some of the impurities for forming the second portion and to make electrical contact with the second portion of the doped semiconductor region for providing a conductive path between the conductive track and the gate conductive region through the first and second portions of the doped semiconductor region so as to establish electrical contact between the conductive track and the gate conductive region.

11. A semiconductor device according to claim 10, wherein the second doped semiconductor layer also defines doped regions for forming contact regions for the source and drain regions of the insulated gate field effect transistor.

12. A semiconductor device according to claim 10, wherein the semiconductor body defines a circuit having at least two insulated gate field effect transistors and the second doped semiconductor layer also defines doped regions providing connections between the insulated gate field effect transistors.

13. A semiconductor device according to claim 10, wherein the first doped semiconductor layer comprises a doped polycrystalline silicon layer.

14. A semiconductor device according to claim 10, wherein the second doped semiconductor layer comprises a doped polycrystalline silicon layer having a metal silicide surface region.

* * * * *